(12) United States Patent
Turney et al.

(10) Patent No.: US 11,924,997 B2
(45) Date of Patent: Mar. 5, 2024

(54) TEXTILE WEAVE REDUNDANT LOOP COLD PLATE DESIGN

(71) Applicant: Rockwell Collins, Inc., Cedar Rapids, IA (US)

(72) Inventors: Joseph Turney, Amston, CT (US); Kimberly Saviers, Glastonbury, CT (US); Ram Ranjan, West Hartford, CT (US); Robert H. Dold, Monson, MA (US); Kathryn L Kirsch, Manchester, CT (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 24 days.

(21) Appl. No.: 17/505,408

(22) Filed: Oct. 19, 2021

(65) Prior Publication Data

US 2023/0123004 A1     Apr. 20, 2023

(51) Int. Cl.
*H05K 7/20* (2006.01)
*F28D 7/00* (2006.01)
*F28D 15/02* (2006.01)

(52) U.S. Cl.
CPC ....... *H05K 7/20254* (2013.01); *F28D 7/0033* (2013.01); *F28D 15/0266* (2013.01); *H05K 7/20272* (2013.01)

(58) Field of Classification Search
CPC .. H05K 7/20272; H05K 7/20254; H05K 7/20; F28D 15/0266; F28D 7/0033; F28D 9/0273; F28D 7/0066; F28D 7/00; F28D 7/0083; F28D 2021/0021; F28D 15/02; F28F 9/0273; F28F 9/02
See application file for complete search history.

(56) References Cited

U.S. PATENT DOCUMENTS

| | | | |
|---|---|---|---|
| 5,170,319 A | 12/1992 | Chu et al. | |
| 8,919,426 B2 | 12/2014 | Hardesty | |
| 10,749,288 B2 | 8/2020 | Weltsch et al. | |
| 11,015,872 B2 | 5/2021 | Aston et al. | |
| 2007/0074853 A1 | 4/2007 | Popovich | |
| 2007/0119565 A1 | 5/2007 | Brunschwiler et al. | |
| 2011/0317369 A1 | 12/2011 | Pautsch et al. | |
| 2012/0210730 A1* | 8/2012 | Pruett | F25B 21/02 62/3.2 |
| 2017/0131034 A1* | 5/2017 | Ribarov | F28F 9/02 |
| 2018/0087842 A1* | 3/2018 | Chainer | F28F 9/02 |

FOREIGN PATENT DOCUMENTS

| | | | |
|---|---|---|---|
| JP | 2017203609 A | * | 11/2017 |
| KR | 20060120872 A | | 11/2006 |

* cited by examiner

*Primary Examiner* — Harry E Arant
(74) *Attorney, Agent, or Firm* — Suiter Swantz pc llo

(57) ABSTRACT

A cold plate apparatus is disclosed. A cold plate includes a first set of sinusoidal conduits and a second set of sinusoidal conduits formed therein. The first set of sinusoidal conduits is arranged in a first direction, and the second set of sinusoidal conduits is arranged in a second direction. Crests of the first set of sinusoidal conduits overlap troughs of the second set of sinusoidal conduits. Crests of the second set of sinusoidal conduits overlap troughs of the first set of sinusoidal conduits. A first set of header plates is fluidically coupled to the first set of sinusoidal conduits, and a second set of header plates is fluidically coupled to the second set of sinusoidal conduits.

13 Claims, 7 Drawing Sheets

TEXTILE WEAVE REDUNDANT LOOP COLD PLATE DESIGN

BACKGROUND

Cold plates are conventionally used to cool electronics by transporting waste heat via a circulating fluid. In aerospace applications, cold plates need to be lightweight and have a low thermal resistance. For critical applications, a cold plate has two redundant cooling loops to accommodate a faulted condition in which one loop is not operational.

SUMMARY

A cold plate apparatus is disclosed in accordance with one or more illustrative embodiments of the present disclosure. In one illustrative embodiment, the cold plate apparatus comprises a cold plate including a first set of sinusoidal conduits formed in the cold plate, and a second set of sinusoidal conduits formed in the cold plate. The first set of sinusoidal conduits is arranged in a first direction and the second set of sinusoidal conduits is arranged in a second direction. The first direction is orthogonal to the second direction. Crests of the first set of sinusoidal conduits overlap troughs of the second set of sinusoidal conduits. Crests of the second set of sinusoidal conduits overlap troughs of the first set of sinusoidal conduits.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
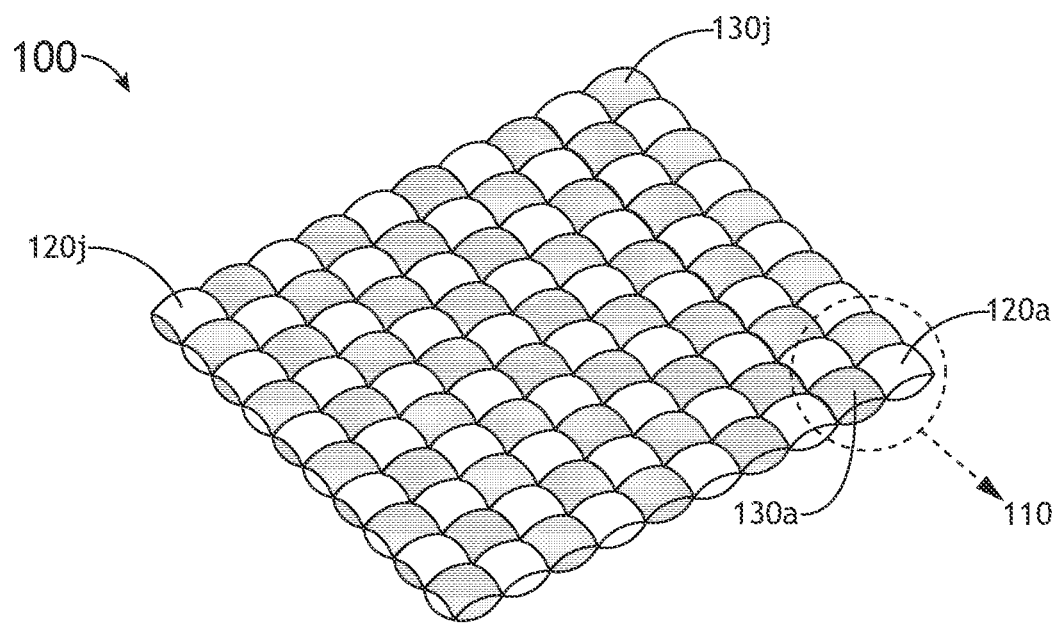
FIG. 1 is an isometric view of a redundant cold plate comprising interwoven sinusoidal conduits, in accordance with one or more embodiments of the present disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the present disclosure, numerous specific details are set forth in order to provide a more thorough understanding of the inventive concepts. However, it will be apparent to one of ordinary skill in the art having the benefit of the present disclosure that the inventive concepts disclosed herein may be practiced without these specific details. In other instances, well-known features may not be described in detail to avoid unnecessarily complicating the present disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). In addition, use of the "a" or "an" are employed to describe elements and components of embodiments of the present inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the present disclosure.

Cold plates are conventionally used to cool electronics (or other heat loads) by transporting waste heat via a circulating fluid. In aerospace applications, cold plates need to be lightweight and have a low thermal resistance. For critical applications, a cold plate can include two redundant cooling loops to accommodate a faulted condition in which one loop is not operational.

The redundant cold plate design entails one cooling loop stacked on top of another cooling loop (e.g., two cooling loop layers). A problem arises when the loop closer (i.e., proximate) to the heat load fails. In such a case, the cooling loop further (i.e., distal) from the electronics transports heat with a reduced efficiency (since the failed cooling loop increases the thermal resistance between the active cooling loop and the electronics). Thus, a redundant cold plate solution that transports heat efficiently (even when one loop is inactive) is desirable.

Embodiments of the present disclosure are directed to a redundant cold plate apparatus including two cooling loops that are interwoven together (e.g., in a textile-weave pattern). The peaks of each cooling loop overlap the valleys of the other cooling loop. With the interwoven pattern, both cooling loops are capable of transporting heat away from adjacent heat loads (e.g., electronics in substantial thermal contact with the top side or the bottom side of the cold plate apparatus). In some embodiments, the present apparatus may function as a heat exchanging device between coolant fluids (such that a first coolant fluid circulating in a first cooling loop dissipates heat to a second coolant fluid circulating in a second cooling loop). In some embodiments, the present apparatus may simultaneously cool a heat load (on the surface of the cold plate) and exchange heat between two coolant fluids.

FIG. 1 an isometric view of a redundant cold plate 100 including interwoven conduits 120a-j and 130a-j formed in the cold plate 100, in accordance with one or more embodiments of the present disclosure. The cold plate 100 may be a block comprising a metal or ceramic material, and the conduits 120a-j and 130a-j may be channels that are formed in the block of metal or ceramic. The first set of conduits 120a-j may be arranged in a first direction (i.e., oriented along the first direction). The second set of conduits 130a-j may be arranged in a second direction (i.e., oriented along the second direction). The second direction may be orthogonal (perpendicular) or substantially orthogonal to the first direction. In some embodiments, the first direction and the second direction may be offset at 45° (so that the conduits 120a-j are offset at 45° with respect to the conduits 130a-j), and the cold plate 100 may have a parallelogram shape. Although ten conduits 120a-j and ten conduits 130a-j are shown, the number of conduits 120a-j and 130a-j are not limited thereto.

Figure 2:
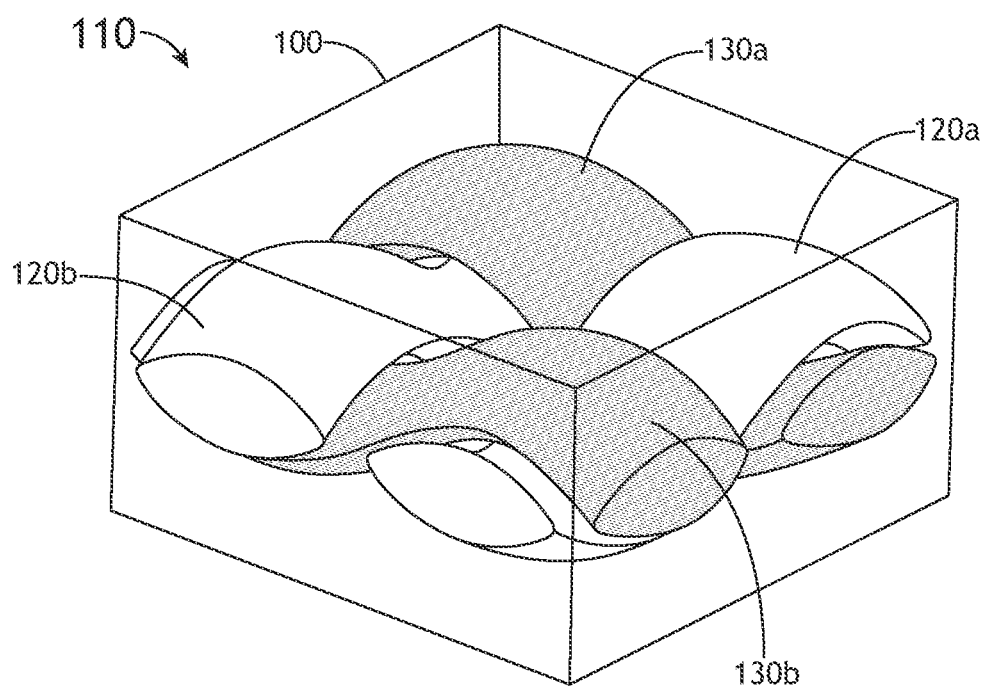
FIG. 2 is a close-up isometric view of a section of the redundant cold plate shown in FIG. 1, in accordance with one or more embodiments of the present disclosure.

FIG. 2 is a close-up isometric view of a section 110 of the redundant cold plate 100 shown in FIG. 1, in accordance with one or more embodiments of the present disclosure. The section 110 may be a unit cell (e.g., repeating pattern) of the cold plate 100. The conduits 120a-j and 130a-j may undulate with a sinusoidal waveform (i.e., like a sine wave). The crests (i.e., peaks) of the first set of sinusoidal conduits 120a-j may overlap the troughs (i.e., valleys) of the second set of sinusoidal conduits 130a-j. Likewise, the crests of the second set of sinusoidal conduits 130a-j may overlap the troughs of the first set of sinusoidal conduits 120a-j. In this way, the conduits 120a-j and 130a-j may be formed in the cold plate 100 in a plain textile weave pattern.

Although a curved waveform is shown in FIGS. 1-2, the conduits 120a-j and 1301-j may have other waveforms. For example, the conduits 120a-j and 1301-j may have a square waveform, a triangle waveform, etc. In some embodiments, the sinusoidal conduits 120a-j and 130a-j may have a clipped waveform (e.g., having flat, linear surfaces at the maxima and minima of an otherwise curved sinusoidal waveform). The clipped waveform may increase thermal contact between the sinusoidal conduits 120a-j and 130a-j and adjacent heat loads (e.g., a flat plate to which electronics are attached), since the flat surfaces of the clipped waveform may allow coolant fluid to be closer to the surface of the heat load (thus reducing the thermal resistance and the weight of the cold plate 100).

In some embodiments, the cold-plate 100 may comprise a metal. For example, the metal may comprise aluminum, copper, titanium, silver, gold, magnesium, lithium, or an alloy thereof. In some embodiments, the metal comprises a copper-tungsten pseudoalloy or AlSiC (silicon carbide in aluminium matrix). In some embodiments, the cold-plate 100 may comprise a ceramic. The ceramic may comprise SiC, $Si_3N_4$, AlN, BeO, graphite, etc. It is noted that the sinusoidal conduits 120a-j and 130a-j may comprise other metals or ceramics, and are not limited to the materials described herein.

In some embodiments, the cold plate 100 may be manufactured via 3D printing (i.e., additive manufacturing). The sinusoidal conduits 120a-j and 130a-j may be formed in the cold plate 100 layer-by-layer using a CAD model or a digital 3D model. 3D printing may comprise direct metal laser sintering (DMLS) the cold plate 100 to form the sinusoidal conduits 120a-j and 130a-j. DMLS may entail using a high power laser (e.g., a carbon dioxide laser) as the power source to sinter powdered metal, aiming the laser automatically at points in space defined by a 3D model, binding the material (e.g. metal powder) together to create a solid structure. After each cross-section is scanned, the powder bed may be lowered by one layer thickness, a new layer of material may be applied on top of the structure, and the process may be repeated until the cold plate 100 is formed.

The sinusoidal conduits 120a-j and 130a-j may be substantially cylindrical and substantially hollow (e.g., each may have a void or cavity) such that a coolant fluid can circulate therein. It is noted that the term "conduit" as used in the present disclosure may be interchangeable with the terms "tube," "channel," or "pipe."

The first set of sinusoidal conduits 120a-j may be configured to circulate a first quantity of coolant fluid. The second set of sinusoidal conduits 130a-j may be configured to circulate a second quantity of coolant fluid. The coolant fluid may comprise propylene glycol or ethylene glycol, however the present disclosure is not limited thereto. For example, the coolant fluid may comprise water, deionized water, ethanol, methanol, potassium acetate/formate, calcium chloride, or a mixture thereof. In some embodiments, the coolant fluid may comprise a water-vapor mixture (i.e., two-phase flow).

In some embodiments, the coolant fluid comprises a dielectric fluid. The dielectric fluid may be non-conductive and may be safer than water for cooling sensitive electronics (e.g., aerospace electronics adjacent to the cold plate 100). The dielectric fluid may comprise, for example, aromatics (e.g., diethyl benzene [DEB], dibenzyl toluene, diaryl alkyl, partially hydrogenated terphenyl), silicate-esters, aliphatics (e.g., polyalphaolefins [PAO]), silicones (dimethyl-siloxane and methyl phenyl-polysiloxane), or fluorocarbons (FC-72, FC-77, hydrofluoroethers [HFE] and perfluorocarbon ethers [PFE]).

FIGS. 3-7 are isometric views of cold plates having alternative weave patterns, in accordance with one or more embodiments of the present disclosure. Each alternative weave pattern may have different performance characteristics relating to pressure drop and heat transfer. Therefore, the weave pattern may be selected as customized to the needs of a particular redundant loop cold plate application. The components described with respect to FIGS. 3-7 may be substantially similar or substantially identical in material composition and function to the components described with respect to FIGS. 1-2. However, the components described with respect to FIGS. 3-7 may have a different form or shape than the components described with respect to FIGS. 1-2.

Figure 3:
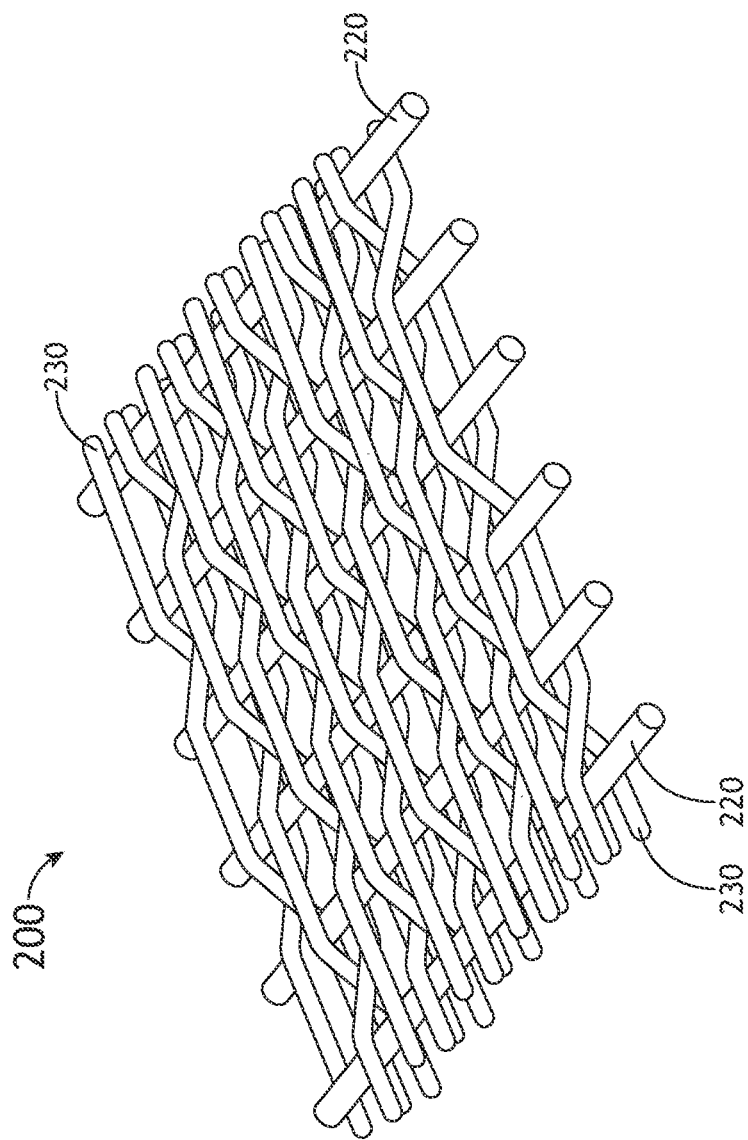
FIGS. 3-7 are isometric views of cold plates having alternative weave patterns, in accordance with one or more embodiments of the present disclosure.

FIG. 3 is an isometric view of a cold plate 200 having a twill dutch weave pattern, in accordance with one or more embodiments of the present disclosure. A first set of conduits 220 in a first direction may be cylindrical and straight (i.e., without a waveform). A second set of conduits 230 in a second direction may have a sinusoidal form. Each crest of the sinusoidal conduits 230 may overlap two of the cylindrical conduits 220.

Figure 4:
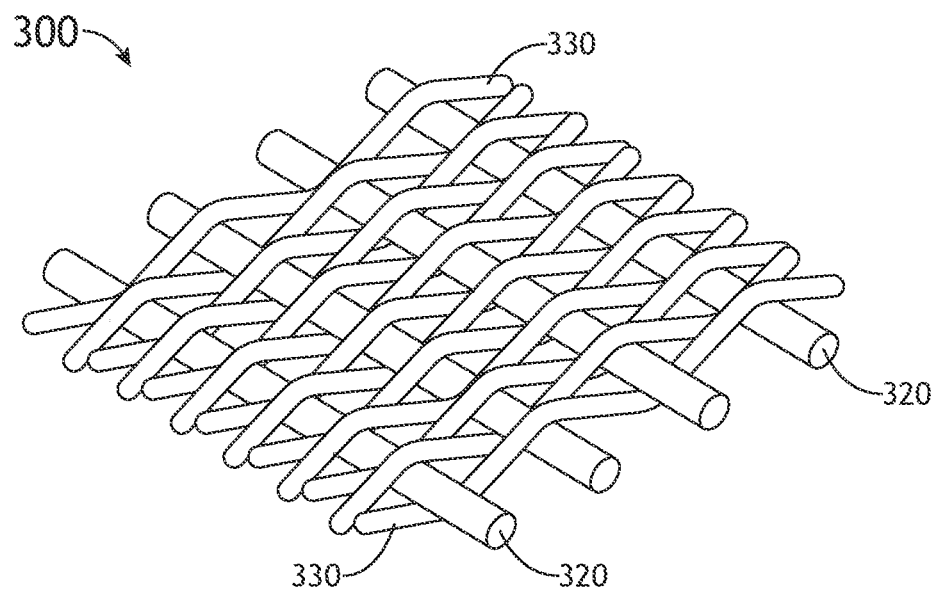

FIG. 4 is an isometric view of a cold plate 300 having a plain dutch weave pattern, in accordance with one or more embodiments of the present disclosure. A first set of conduits 320 in a first direction may be cylindrical and straight (i.e., without a waveform). A second set of conduits 330 in a second direction (may have a sinusoidal form. Each crest of the sinusoidal conduits 330 may overlap one of the cylindrical conduits 320. The plain dutch weave pattern may alternate such that the crests some of the sinusoidal conduits 330 overlap some of the cylindrical conduits 320, while the crests of others of the sinusoidal conduits 330 overlap others of the cylindrical conduits 320.

Figure 5:
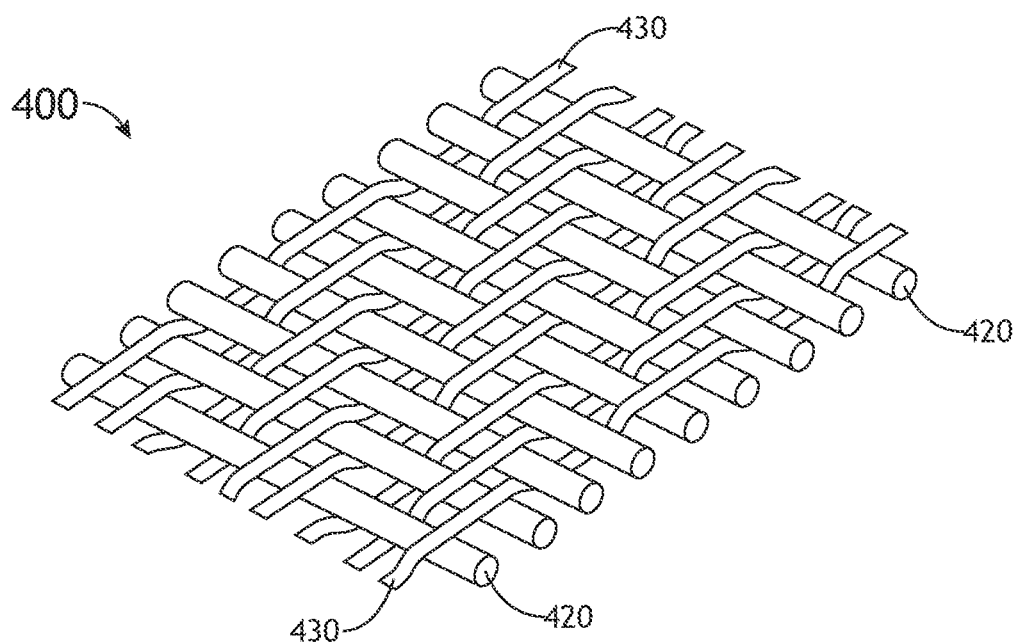

FIG. 5 is an isometric view of a cold plate 400 having a twill weave pattern, in accordance with one or more embodiments of the present disclosure. A first set of conduits 420 in a first direction may be cylindrical and straight (i.e., without a waveform). A second set of conduits 430 in a second direction may have a sinusoidal form. Each crest of the sinusoidal conduits 430 may overlap two of the cylindrical conduits 420. The twill weave pattern may alternate such that the crests some of sinusoidal conduits 430 overlap some of the cylindrical conduits 420, while the crests of others of the sinusoidal conduits 430 overlap others of the cylindrical conduits 320. The overlap of each successive sinusoidal conduit 430 may be offset such that a diagonal pattern is perceptible.

Figure 6:
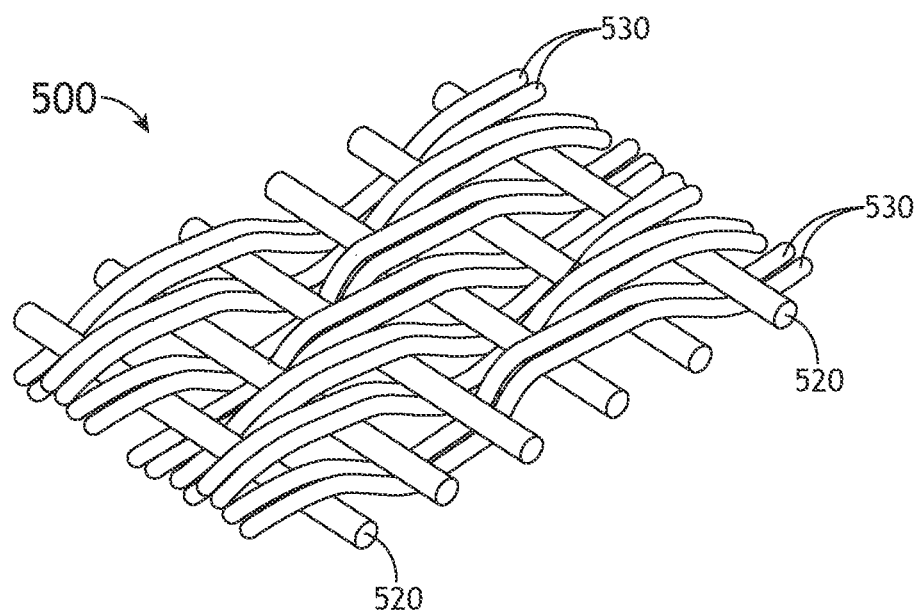

FIG. 6 is an isometric view of a cold plate 500 having a twill double dutch weave pattern, in accordance with one or more embodiments of the present disclosure. A first set of conduits 520 in a first direction may be cylindrical and straight (i.e., without a waveform). A second set of conduits 530 in a second direction may have a sinusoidal form. Each crest of the sinusoidal conduits 530 may overlap two of the cylindrical conduits 520. The twill double dutch weave pattern may alternate in pairs of sinusoidal conduits 530, such that the crests and troughs of each sinusoidal conduit 520 in the pair are aligned (i.e., the two waveforms have a phase offset of 0).

Figure 7:
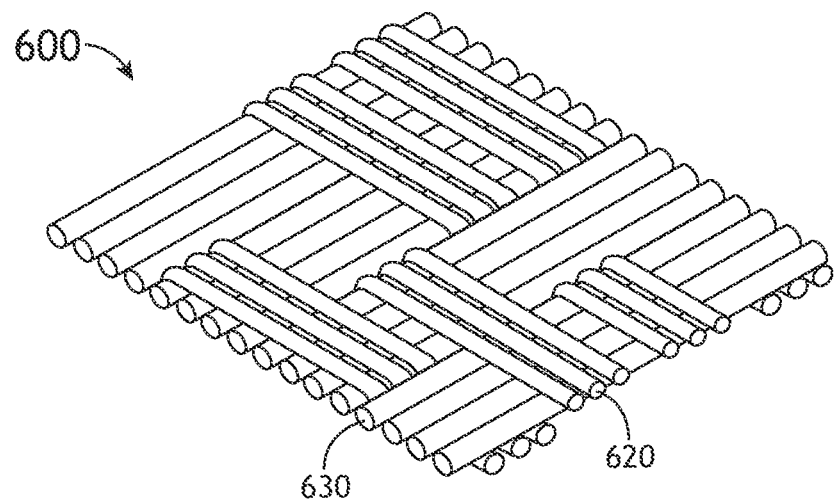

FIG. 7 is an isometric view of a cold plate 600 having a stranded weave pattern, in accordance with one or more embodiments of the present disclosure. A first set of conduits 630 in a first direction may be cylindrical and straight (i.e., without a waveform). A second set of conduits 620 in a second direction may have a sinusoidal form. Each crest of the sinusoidal conduits 620 may overlap three or more of the cylindrical conduits 630. The stranded weave pattern may alternate in groups of sinusoidal conduits 620, such that the crests and troughs of each sinusoidal conduit 620 in the group are aligned (i.e., the waveforms have a phase offset of 0). The overlap of each successive group of sinusoidal conduits 630 may be offset such that a diagonal pattern is perceptible.

Figure 8:
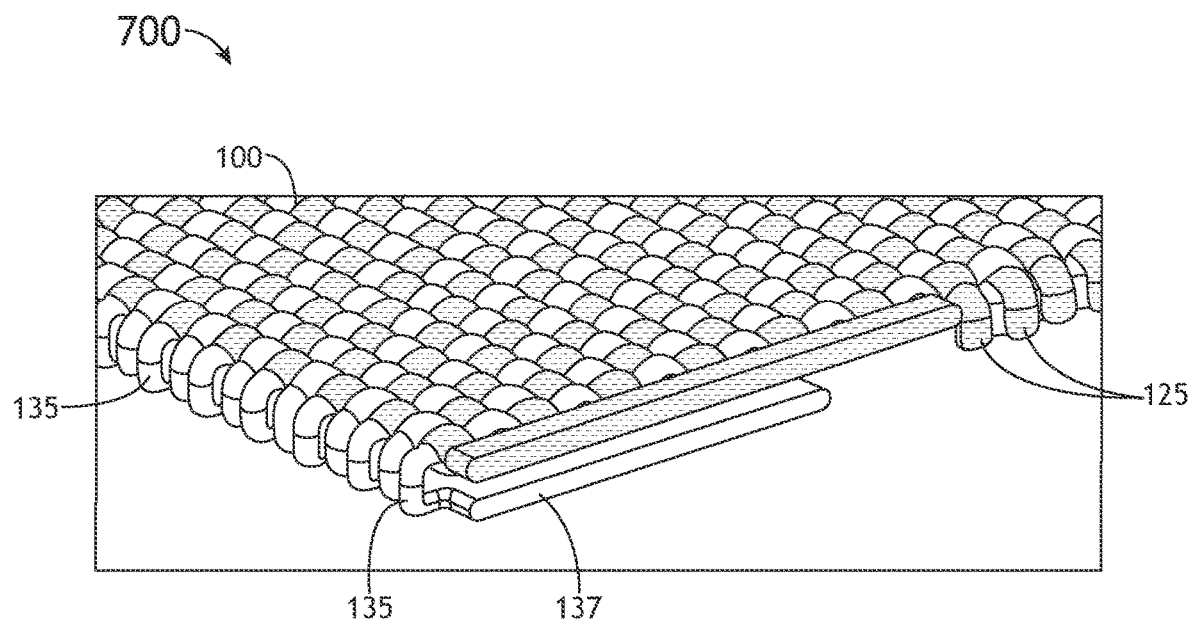
FIG. 8 is a top isometric view of a cold plate apparatus, in accordance with one or more embodiments of the present disclosure.
Figure 9:
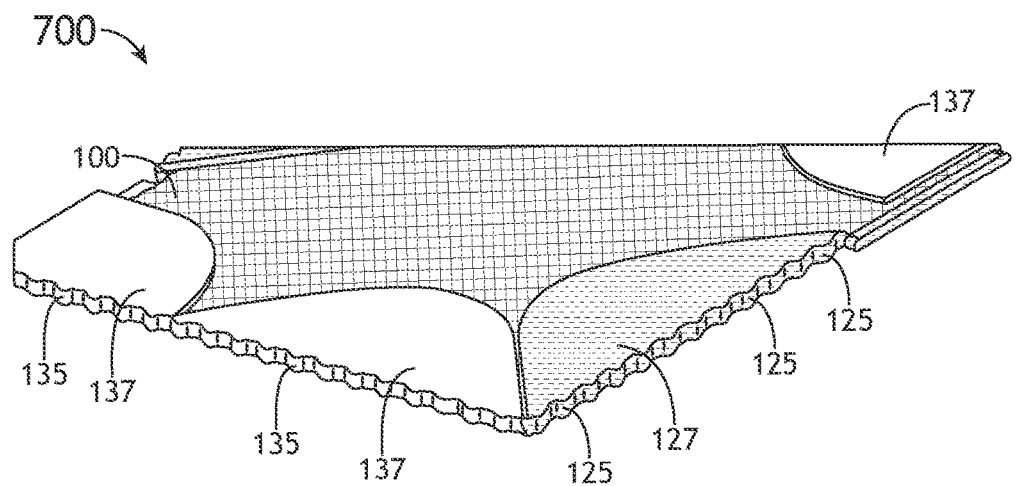
FIG. 9 is a bottom isometric view of the cold plate apparatus shown in FIG. 8, in accordance with one or more embodiments of the present disclosure.

FIG. 8 is a top isometric view of a cold plate apparatus 700, in accordance with one or more embodiments of the present disclosure. FIG. 9 is a bottom isometric view of the cold plate apparatus 700, in accordance with one or more embodiments of the present disclosure. A central portion of the cold plate apparatus 700 may include the cold plate 100 including the first set of sinusoidal conduits 120 and the second set of sinusoidal conduits 130 (described with respect to FIGS. 1-2).

A first set of header plates 127 may be substantially adjacent to the first set of sinusoidal conduits 120 and the second set of sinusoidal conduits 130. A second set of header plates 137 may be substantially adjacent to the first set of sinusoidal conduits 120 and the second set of sinusoidal conduits 130. In some embodiments, the header plates 127 and 137 may be in thermal contact with the cold plate 100 (and thus may physically contact the cold plate 100). In other embodiments, the header plates 127 and 137 may be substantially adjacent the cold plate 100 without physically contacting the cold plate 100. Although the header plates 127 and 137 are shown as overlapping a bottom surface of the cold plate 100 (in FIG. 9), it is contemplated that the header plates 127 and 137 may be located in the same layer as the sinusoidal conduits 120 and 130 (coplanar with the conduits 120 and 130). Additionally, the header plates 127 and 137 may be located at a periphery of the cold plate 100 (the outside edges of the cold plate 100) instead of overlapping the cold plate 100.

The header plates 127 and 137 may be substantially hollow (i.e., have a cavity therein), and may be substantially similar or substantially identical in material composition to the cold plate 100 as described with respect to FIGS. 1-2. The width and/or length of each of the header plates 127 and 137 may be substantially greater than the thickness (i.e., height) of each header plate (e.g., forming a flat plenum structure). Each of the header plates 127 may include a cavity configured to circulate the first quantity of coolant fluid therein. Each of the header plates 137 may include a cavity configured to circulate the second quantity of coolant fluid therein. The header plates 127 and 137 may increase the contact time of coolant fluid with the cold plate 100, and may thus increase the heat transfer efficiency of the cold plate 100 (e.g., the transfer of heat from target heat loads to the cold plate 100).

The first set of header plates 127 may be fluidically coupled to the first set of sinusoidal conduits 120 via a first set of connection members 125. The second set of header plates 137 may be fluidically coupled to the second set of sinusoidal conduits 130 via a second set of connection members 135. The connection members 125 and 135 may be formed in the cold plate 100 (e.g., as conduits or channels). The connection members 125 and 135 may have a cylindrical shape, however other shapes are also possible. For example, the connection members 125 and 135 may have a cuboid shape (e.g., that is flush with one or more faces of the respective header plate 127 or 137).

Figure 10A:
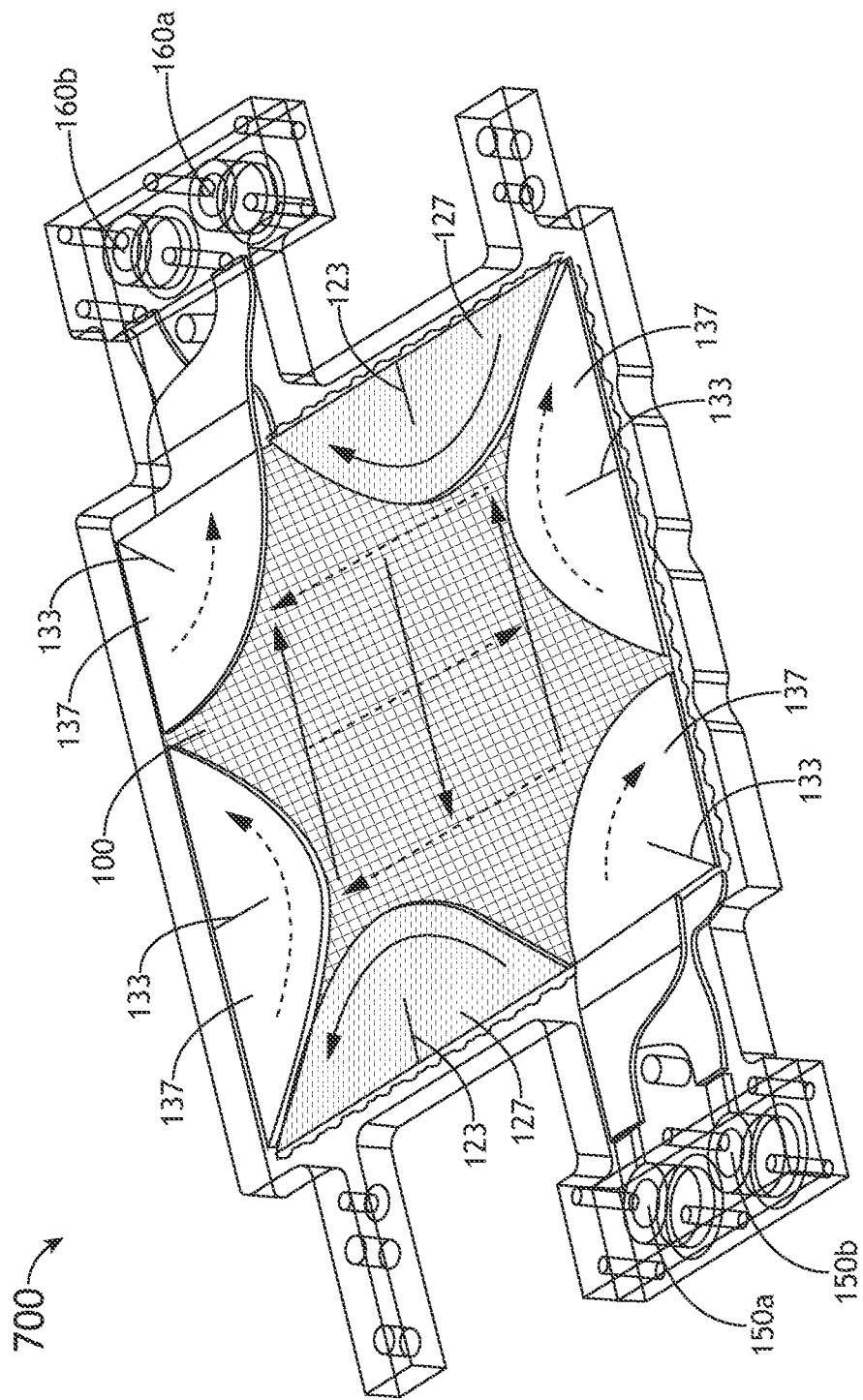
FIGS. 10A-B are a bottom isometric views of the cold plate apparatus shown in FIGS. 8-9 illustrating the circulation of coolant fluid, in accordance with one or more embodiments of the present disclosure.

Referring now to FIG. 10A, each of the first set of header plates 127 may include a guiding vane 123 (e.g., in a cavity of the respective header plate 127). Each guiding vane 123 may be configured to guide coolant fluid from some of the first set of connecting members 125 to others of the first set of connecting members 125 (e.g., the connecting members 125 substantially adjacent to the respective header plate 127). Each guiding vane 123 may change the direction of flow of the coolant fluid in the first sinusoidal conduits 120. For example, cooling fluid that enters a header plate 127 in the first direction may exit the header plate 127 in a third direction opposite to the first direction (i.e., the direction of flow changes from the positive first direction to the negative first direction). The direction of flow of the coolant liquid in the first set of sinusoidal conduits 120 may invert several times. Although FIG. 10A shows the direction of flow of the coolant liquid in the first set of sinusoidal conduits 120 inverting three times, the coolant liquid may invert more than three times or less than three times depending on the number of header plates 127 and guiding vanes 123 (for example, five times, ten times, or none at all).

Likewise, each of the second set of header plates 137 may include a guiding vane 133 (e.g., in a cavity of the respective header plate 137). Each guiding vane 133 may be configured to guide coolant fluid from some of the second set of connecting members 135 to others of the second set of connecting members 135 (e.g., the connecting members 135 substantially adjacent to the respective header plate 137). Each guiding vane 133 may change the direction of flow of the coolant fluid in the second set of sinusoidal conduits 130. For example, cooling fluid that enters a header plate 137 in the second direction may exit the header plate 137 in a fourth direction opposite to the second direction (i.e., the direction of flow changes from the positive second direction to the negative second direction). The direction of flow of the coolant liquid in the second set of sinusoidal conduits 130 may invert several times. Although FIG. 10A shows the direction of flow of the coolant liquid in the second set of sinusoidal conduits 130 inverting three times, the coolant liquid may invert more than three times or less than three times depending on the number of header plates 137 and guiding vanes 133 (for example, five times, ten times, or none at all).

The guiding vanes 123 and 133 may have a flat wall or blade shape within a cavity of the respective header plate 127 or 137. The guiding vanes 123 and 133 may be substantially similar or substantially identical in material composition to the cold plate 100 as described with respect to FIGS. 1-2. Each of the guiding vanes 123 and 133 may have an aperture or hole configured to pass coolant fluid from a first side of the respective header plate 127 or 137 to a second side of the respective header plate 127 or 137.

A first inlet port 150*a* may be fluidically coupled to the first set of sinusoidal conduits 120, and a first outlet port 160*b* may be fluidically coupled to the first set of sinudoidal conduits 120. The first quantity of coolant fluid may be configured to enter the cold plate 100 via the first inlet port 150*a* and exit the cold plate 100 via the first outlet port 160*b*. Likewise, a second inlet port 150*b* may be fluidically coupled to the second set of sinusoidal conduits 130, and a second outlet port 160*a* may be fluidically coupled to the second set of sinudoidal conduits 130. The second quantity of coolant fluid may be configured to enter the cold plate 100 via the second inlet port 150*b* and exit the cold plate 100 via the second outlet port 160*a*.

A first heat exchanger may be fluidically coupled to the first inlet port 150*a* and the first outlet port 160*b*, and a first pump may be configured to circulate the first quantity of coolant fluid in the first set of sinusoidal conduits 120, the first set of header plates 127, the first inlet port 150*a*, the first outlet port 160*b*, and the heat exchanger. Likewise, a second heat exchanger may be fluidically coupled to the second inlet port 150*b* and the second outlet port 160*a*, and a second pump may be configured to circulate the second quantity of coolant fluid in the second set of sinusoidal conduits 130, the second set of header plates 137, the second inlet port 150*b*, the second outlet port 160*a*, and the second heat exchanger.

Figure 10B:
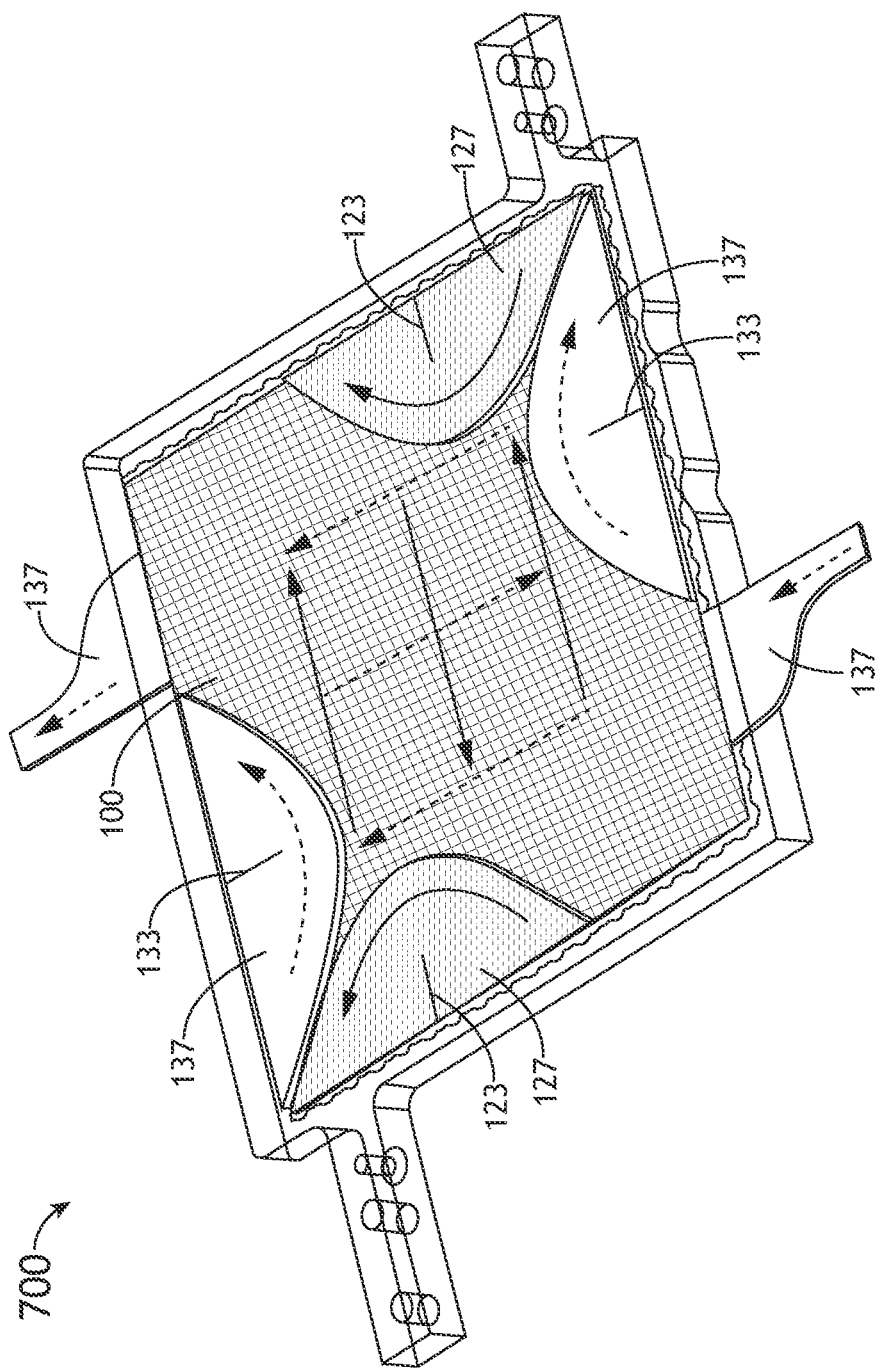

(FIG. 10B shows an alternative configuration of the cold plate apparatus 700 shown in FIG. 10A. In the alternative configuration, some of the header plates 127 and 137 may be located orthogonally to the cold plate 100 at a periphery of the cold plate 100 (e.g., coplanar with the conduits 120 and 130). Although FIG. 10B shows some of the second set of header plates 137 being orthogonal and at the periphery of the cold plate 100, some of the first set of header plates 127 may also be orthogonal and at the periphery of the cold plate 100. The alternative configuration shown in FIG. 10B may decrease the number of inversions as the coolant fluid moves through the cold plate 100, but may increase the footprint area of the cold plate 100.

The present cold plate apparatus 700 is advantageous since the interwoven conduits in the cold plate 100 enable each conduit to contact the surface of the plate where heat loads (e.g., targeted electronics) are mounted. A failure in one cooling loop does not create a tortuous conduction path (which happens when cooling channels are in different layers). The waviness (undulation) of the conduits can augment heat transfer compared to straight conduits, thus leading to a lower overall thermal resistance. The multi-pass flow arrangement can increase fluid velocity (increase heat transfer coefficient) and may result in increased efficiency when cooling non-uniform heat loads (since more fluid is in direct contact with each part of the cold plate 100).

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A cold plate apparatus, comprising:
 a cold plate including a first set of sinusoidal conduits formed in the cold plate and a second set of sinusoidal conduits formed in the cold plate;
 wherein the first set of sinusoidal conduits is arranged in a first direction;
 wherein the second set of sinusoidal conduits is arranged in a second direction;
  wherein the first direction is orthogonal to the second direction;
  wherein crests of the first set of sinusoidal conduits overlap troughs of the second set of sinusoidal conduits;
  wherein crests of the second set of sinusoidal conduits overlap troughs of the first set of sinusoidal conduits;
 a first set of header plates substantially adjacent to the first set of sinusoidal conduits and the second set of sinusoidal conduits; and
 a second set of header plates substantially adjacent to the first set of sinusoidal conduits and the second set of sinusoidal conduits;
 wherein the first set of header plates and the second set of header plates are disposed below and overlap a bottom surface of the cold plate;
 a first set of connecting members fluidically coupling the first set of header plates to the first set of sinusoidal conduits; wherein at least one of the first set of header plates include a first guiding vane therein, the first guiding vane being configured to guide coolant fluid from some of the first set of connecting members to others of the first set of connecting members inverting a flow of the coolant fluid in the first set of sinusoidal conduits; and
 a second set of connecting members fluidically coupling the second set of header plates to the second set of sinusoidal conduits.

2. The cold plate apparatus of claim 1, wherein the first set of sinusoidal conduits, the second set of sinusoidal conduits, the first set of header plates, and the second set of header plates are configured to circulate the coolant fluid.

3. The cold plate apparatus of claim 2, wherein the coolant fluid comprises at least one of propylene glycol or ethylene glycol.

4. The cold plate apparatus of claim 1, wherein the cold plate, the first set of header plates, and the second set of header plates comprise a metal.

5. The cold plate apparatus of claim 4, wherein the metal comprises at least one of copper or aluminum.

6. The cold plate apparatus of claim 1, wherein at least one of the second set of header plates include a second guiding vane therein, the second guiding vane being configured to guide the coolant fluid from some of the second set of connecting members to others of the second set of connecting members inverting a flow of the coolant fluid in the second set of sinusoidal conduits.

7. The cold plate apparatus of claim 1, wherein a first inlet port is fluidically coupled to the first set of sinusoidal conduits, and a first outlet port is fluidically coupled to the first set of sinusoidal conduits.

8. The cold plate apparatus of claim 7, wherein a heat exchanger is fluidically coupled to the first inlet port and the first outlet port, and a pump is configured to circulate the coolant fluid in the first set of sinusoidal conduits, the first set of header plates, the first inlet port, the first outlet port, and the heat exchanger.

9. The cold plate apparatus of claim 1, wherein a second inlet port is fluidically coupled to the second set of sinusoidal conduits, and a second outlet port is fluidically coupled to the second set of sinusoidal conduits.

10. The cold plate apparatus of claim 9, wherein a heat exchanger is fluidically coupled to the second inlet port and the second outlet port, and a pump is configured to circulate the coolant fluid in the second set of sinusoidal conduits, the second set of header plates, the second inlet port, the second outlet port, and the heat exchanger.

11. The cold plate apparatus of claim 1, wherein the first set of header plates are in thermal contact with the first set of sinusoidal conduits; wherein the second set of header plates are in thermal contact with the second set of sinusoidal conduits.

12. The cold plate apparatus of claim 1, wherein the first set of header plates and the second set of header plates form a flat plenum structure.

13. The cold plate apparatus of claim 1, wherein the flow of the coolant fluid in the first set of sinusoidal conduits is parallel to the bottom surface of the cold plate.

\* \* \* \* \*